United States Patent
Rasbornig et al.

(10) Patent No.: US 10,514,410 B2
(45) Date of Patent: *Dec. 24, 2019

(54) SENSOR SELF-DIAGNOSTICS USING MULTIPLE SIGNAL PATHS

(71) Applicant: Infineon Technologies AG, Neubiberg (DE)

(72) Inventors: Friedrich Rasbornig, Klagenfurt (AT); Mario Motz, Wernberg (AT); Dirk Hammerschmidt, Finkerstein (AT); Ferdinand Gastinger, Woelfnitz (AT); Bernhard Schaffer, Villach (AT); Wolfgang Granig, Seeboden (AT)

(73) Assignee: Infineon Technologies AG, Neubiberg (DE)

(*) Notice: Subject to any disclaimer, the term of this patent is extended or adjusted under 35 U.S.C. 154(b) by 0 days.

This patent is subject to a terminal disclaimer.

(21) Appl. No.: 16/046,093

(22) Filed: Jul. 26, 2018

(65) Prior Publication Data

US 2018/0328971 A1 Nov. 15, 2018

Related U.S. Application Data

(63) Continuation of application No. 15/132,783, filed on Apr. 19, 2016, now Pat. No. 10,145,882, which is a
(Continued)

(51) Int. Cl.
*G01R 31/00* (2006.01)
*G01R 31/26* (2014.01)
(Continued)

(52) U.S. Cl.
CPC .......... *G01R 31/007* (2013.01); *B60T 8/885* (2013.01); *G01D 3/08* (2013.01); *B60T 2250/06* (2013.01);
(Continued)

(58) Field of Classification Search
CPC .............. G01R 31/007; G01R 31/2884; G01R 31/2829; G01R 31/2644; G01R 31/2856;
(Continued)

(56) References Cited

U.S. PATENT DOCUMENTS 4,451,927 A * 5/1984 Hershberger ........... H04S 1/002
381/15
4,692,299 A 9/1987 Crew et al.
(Continued)

FOREIGN PATENT DOCUMENTS

CN 101073231 A 11/2007
CN 101713673 A 5/2010
(Continued)

OTHER PUBLICATIONS

Office Action dated Jan. 20, 2016 for German Patent Application No. 102011083111.8.
(Continued)

*Primary Examiner* — Christopher P McAndrew
(74) *Attorney, Agent, or Firm* — Schiff Hardin LLP

(57) ABSTRACT

Embodiments relate to systems and methods for sensor self-diagnostics using multiple signal paths. In an embodiment, the sensors are magnetic field sensors, and the systems and/or methods are configured to meet or exceed relevant safety or other industry standards, such as SIL standards. For example, a monolithic integrated circuit sensor system implemented on a single semiconductor ship can include a first sensor device having a first signal path for a first sensor signal on a semiconductor chip; and a second sensor device having a second signal path for a second sensor signal on the semiconductor chip, the second signal path distinct from the first signal path, wherein a comparison of the first signal path signal and the second signal path signal provides a sensor system self-test.

38 Claims, 2 Drawing Sheets

Related U.S. Application Data continuation-in-part of application No. 12/889,749, filed on Sep. 24, 2010, now Pat. No. 9,346,441.

(51) Int. Cl.
  *G01R 31/28* (2006.01)
  *G01D 3/08* (2006.01)
  *B60T 8/88* (2006.01)

(52) U.S. Cl.
  CPC .... *B60T 2270/406* (2013.01); *B60T 2270/411* (2013.01); *B60T 2270/413* (2013.01); *G01R 31/2644* (2013.01); *G01R 31/2829* (2013.01); *G01R 31/2856* (2013.01); *G01R 31/2884* (2013.01)

(58) Field of Classification Search
  CPC ............... B60T 8/885; B60T 2250/06; B60T 2270/411; B60T 2270/413; B60T 2270/406; G01D 3/08
  USPC ........................................................ 324/750.3
  See application file for complete search history.

(56) References Cited

U.S. PATENT DOCUMENTS

| | | | |
|---|---|---|---|
| 4,804,515 A | 2/1989 | Crew et al. | |
| 5,343,404 A | 8/1994 | Girgis | |
| 5,495,427 A | 2/1996 | Puma et al. | |
| 5,589,766 A * | 12/1996 | Frank | G01R 31/2884 324/73.1 |
| 5,965,819 A | 10/1999 | Piety et al. | |
| 6,167,547 A | 12/2000 | Senechal et al. | |
| 6,225,802 B1 | 5/2001 | Ramalho et al. | |
| 6,340,884 B1 | 1/2002 | Wolf et al. | |
| 6,449,567 B1 | 9/2002 | Desai et al. | |
| 6,472,897 B1 * | 10/2002 | Shyr | G11C 17/18 257/529 |
| 6,564,637 B1 | 5/2003 | Schalk et al. | |
| 6,788,088 B2 * | 9/2004 | Throngnumchai | H02M 1/32 324/126 |
| 6,891,389 B1 * | 5/2005 | Walker | G01R 31/3012 324/750.02 |
| 7,046,180 B2 * | 5/2006 | Jongsma | H03M 1/1076 341/141 |
| 7,086,270 B2 | 8/2006 | Weinberg et al. | |
| 7,127,932 B2 | 10/2006 | Morell et al. | |
| 7,355,429 B2 * | 4/2008 | Jenkins | G01R 19/16552 324/750.3 |
| 7,372,248 B2 | 5/2008 | Barthel et al. | |
| 7,565,602 B2 | 7/2009 | Ausserlechner | |
| 2002/0050933 A1 | 5/2002 | Donat et al. | |
| 2002/0067255 A1 | 6/2002 | Tanizawa | |
| 2004/0095218 A1 | 5/2004 | Wan et al. | |
| 2004/0254711 A1 | 12/2004 | Zumberge et al. | |
| 2005/0053005 A1 * | 3/2005 | Cain | H04L 45/123 370/235 |
| 2005/0094763 A1 * | 5/2005 | Sherman | A61B 6/032 378/19 |
| 2005/0124136 A1 | 6/2005 | Piguet et al. | |
| 2005/0216134 A1 | 9/2005 | Katrak et al. | |
| 2006/0049823 A1 | 3/2006 | Suzuki | |
| 2006/0232284 A1 * | 10/2006 | Condon | G01R 31/302 324/750.3 |
| 2006/0267756 A1 | 11/2006 | Kates | |
| 2007/0010967 A1 | 1/2007 | Scherr | |
| 2007/0200564 A1 | 8/2007 | Motz et al. | |
| 2007/0247141 A1 * | 10/2007 | Pastre | G01R 33/0035 324/202 |
| 2007/0260383 A1 | 11/2007 | Sundaram et al. | |
| 2007/0279044 A1 | 12/2007 | Rossmann et al. | |
| 2007/0282459 A1 | 12/2007 | Schafer et al. | |
| 2007/0285950 A1 * | 12/2007 | Nakamura | G05B 19/058 363/1 |
| 2008/0012557 A1 | 1/2008 | Hammerschmidt | |
| 2008/0173518 A1 | 7/2008 | Klusemann | |
| 2008/0245145 A1 | 10/2008 | Mayer et al. | |
| 2008/0272797 A1 * | 11/2008 | Pelgrom | G01R 31/3167 324/750.3 |
| 2009/0112418 A1 | 4/2009 | Buur et al. | |
| 2009/0128160 A1 * | 5/2009 | Chiaburu | G01D 3/08 324/537 |
| 2009/0278711 A1 | 11/2009 | Lohberg et al. | |
| 2010/0097088 A1 * | 4/2010 | Uemura | G01C 19/00 324/750.3 |
| 2010/0147124 A1 | 6/2010 | Seidel et al. | |
| 2012/0016623 A1 * | 1/2012 | Hayner | B60W 50/0205 702/141 |
| 2012/0249170 A1 * | 10/2012 | Baumann | G01R 31/2843 324/750.3 |
| 2012/0262196 A1 * | 10/2012 | Yokou | G01R 31/318513 324/750.3 |
| 2013/0049780 A1 * | 2/2013 | Collins, III | G01R 31/2822 324/750.3 |
| 2013/0076383 A1 * | 3/2013 | Poinstingl | G01R 31/3172 324/750.3 |
| 2013/0200909 A1 | 8/2013 | Rasbornig et al. | |
| 2013/0314075 A1 | 11/2013 | Ausserlechner et al. | |

FOREIGN PATENT DOCUMENTS

| | | | | |
|---|---|---|---|---|
| CN | 102402465 A | 4/2012 | | |
| CN | 102419403 A | 4/2012 | | |
| CN | 102419403 A | 4/2012 | | |
| CN | 102695943 A | 9/2012 | | |
| EP | 1637898 A1 * | 3/2006 | ......... | G01R 33/0035 |
| JP | 2001183254 A | 7/2001 | | |
| JP | 2008-116339 | 5/2008 | | |
| JP | 2012-68248 | 4/2012 | | |
| WO | WO-2005/083449 A2 | 9/2005 | | |
| WO | WO-2005/085892 A1 | 9/2005 | | |
| WO | WO-2009/047812 A1 | 4/2009 | | |

OTHER PUBLICATIONS

Office Action dated Dec. 8, 2015 for Chinese Patent Application No. 201410097855.0.

Ramirez, Edgar, C., "Diverse Redundacy Used in SIS Technology to Achieve Higher Safety Integrity", May 8, 2008.

Diger, et al., "On a Redundant Diversified Steering Angel Sensor", 2003, Proceedings of the 9th IEEE International On-Line Testing Symposium.

Torres-Echeverria, et al., "Design Optimization of a Safety-Intrumented System Based on RAMS+C Addressing of IEC 61508 Requirements and Diverse Redundancy", 2009, Reliability Engineering & System Safety, 94, 162-179.

Suyama, Koichi, "Functional Safety Analysis of Reliable Control Systems Using Decision by Majority", Jun. 1999, Proceedings of the American Control Converence, 618-21.

Application and File History for U.S. Appl. No. 13/833,852, filed Mar. 15, 2013, inventors Rasbornig, et al.

Endress & Hauser, FAQs About Functional Safety, © 2013, http://www.endress.com/eh/home.nsf/#products/~product-instrument-sil-functional-safety-faq-questions, 9 pages.

International Electrotechnical Commission, http://www.iec.ch/functionalsafety/faq-ed2, 9 pages.

Wikipedia, ISO26262, available at http://en.wikipedia.org/wiki/ISO_26262, on Mar. 3, 2014, 6 pages.

Infineon, "Innovative Semiconductor Solutions for Safety Applications", © 1999-2014, 4 pages.

National Instruments, "What is the ISO 26262 Functional Safety Standard?", Published Feb. 23, 2012, as available at www.nni.com, 4 pages.

Paste, et al., "A Hall Sensor Analog Front End for Current Measurement With Continuous Gain Calibration", IEEE Sensors Journal, vol. 7, No. 5, May 2007, pp. 860-867.

Office Action dated Mar. 5, 2018 for Japanese Patent Application No. 2017-081918 (with English translation).

(56) References Cited

OTHER PUBLICATIONS

Office Action dated Apr. 22, 2019 issued for Chinese Patent Application No. 201710257680.9.

* cited by examiner

SENSOR SELF-DIAGNOSTICS USING MULTIPLE SIGNAL PATHS

TECHNICAL FIELD

The invention relates generally to integrated circuit (IC) sensors and more particularly to IC sensor self-diagnostics using multiple communication signal paths.

BACKGROUND

A recent trend in automobile drive technology, as part of developments in the automobile electronics sector, is for established passive safety systems like seatbelts and airbags to be extended by active safety systems, such as anti-lock braking systems (ABS), electronic stability programs (ESP) and electrical steering systems, to provide an increasing range of driver assistance functionalities. As has already been the case in the drive train for some time, system complexity is also continuously increasing here in order to detect hazardous driving situations and contribute to accident avoidance through active interventions by a control system. With ongoing technological advances, these trends are expected to continue and grow stronger in the future.

The resulting significant increase in the number of electronic components with a safety-related functionality has given rise to previously unprecedented requirements in terms of reliability and system availability. In order to be able to achieve this while at the same time meeting cost objectives, it is desired to develop efficient methods for functional self-monitoring through integrated test methods along with redundancies. At the same time, progress is desired in design methodologies in order to be able to identify and avoid possible weaknesses in safety systems early on. In the area of magnetic field sensors, for example, this has been done by the introduction of the Safety Integrity Level (SIL) standard.

In order to meet SIL standards in the automotive field, it is desired to implement and use corresponding self-tests, including built-in self-tests, not only at start-up but also during normal operation, as well as automatic monitoring structures or corresponding redundant functional blocks and/or signal paths. Conventional magnetic sensor systems, in particular linear Hall measuring systems, have used a single-channel analog main signal path. It is technically very difficult, or perhaps even impossible, to meet the SIL requirements in safety-critical applications with this concept. It is therefore no longer possible to cover safety requirements with just one sensor system. Thus, other conventional solutions have used two identical redundant magnetic field sensors to meet SIL requirements. Obviously, a considerable drawback of these solutions is the corresponding doubling of the cost for not one but two sensors. Still other solutions propose a defined superimposed test signal outside the signal frequency rages, such as magnetic field sensors with an additional on-chip conductor loop or pressure sensors with superimposed electrostatic coupling to the sensor.

A need remains for a reliable and cost-efficient sensor system that meets SIL and/or other applicable safety standards.

BRIEF DESCRIPTION OF THE DRAWINGS

The invention may be more completely understood in consideration of the following detailed description of various embodiments of the invention in connection with the accompanying drawings, in which.

Figure 1:
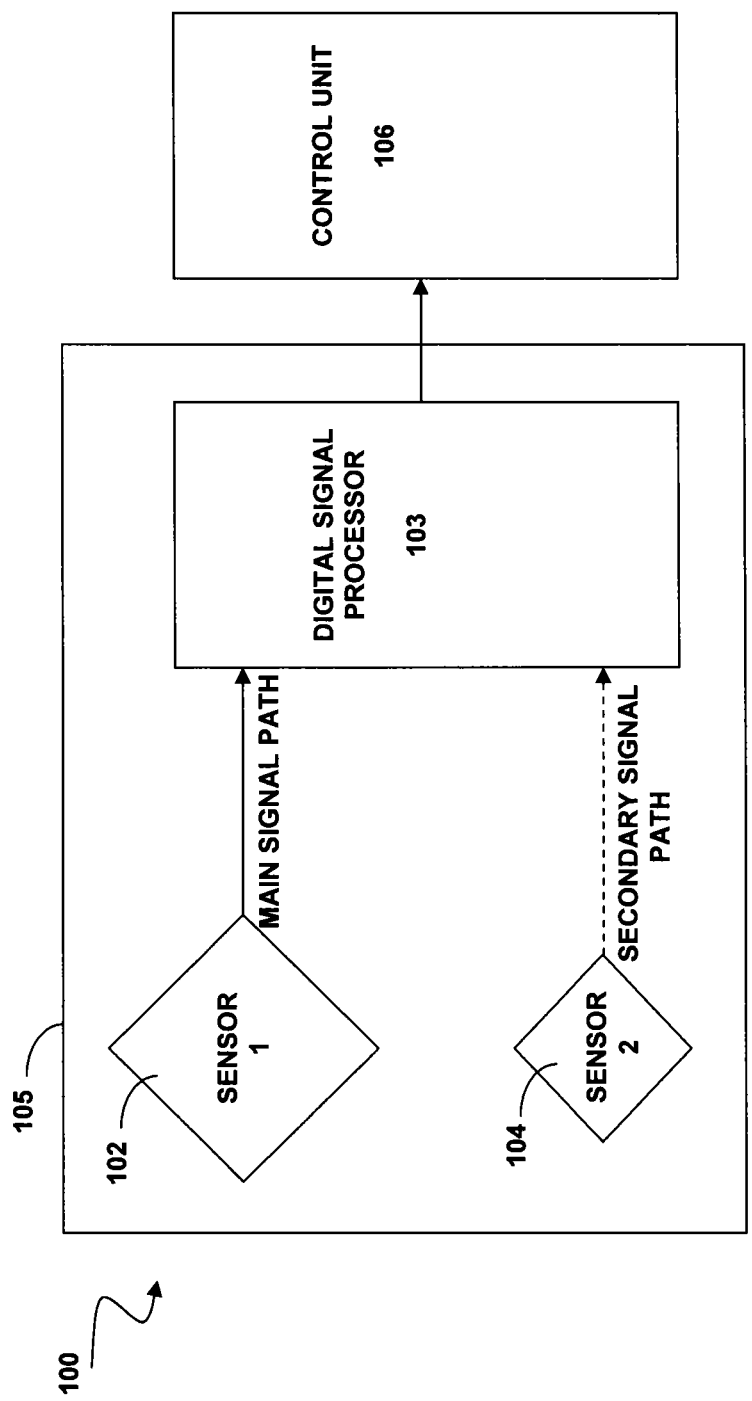
FIG. 1 depicts a system block diagram according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to systems and methods for sensor self-diagnostics using multiple signal paths. In an embodiment, the sensors are magnetic field sensors, and the systems and/or methods are configured to meet or exceed relevant safety or other industry standards, such as SIL standards.

FIG. 1 depicts a conceptual block diagram of a sensor system 100 according to an embodiment. System 100 comprises a first sensor 102 and a second sensor 104 that each communicate with a digital signal processor (DSP) 103. In an embodiment, first sensor 102, second sensor 104 and DSP 103 comprise a monolithic integrated circuit implemented on a single chip 105, and DSP 103 communicates with an external electronic control unit (ECU) 106.

One of the sensors is a primary or main sensor. In the embodiment of FIG. 1, sensor 102 is the main sensor, while sensor 104 is a secondary sensor. Main sensor 102 communicates with DSP 103 via a main signal path, and secondary sensor 104 communicates with DSP 103 via a secondary signal path which is at least partially distinct from the main signal path, as discussed in more detail below.

Secondary sensor 104 and its corresponding secondary signal path is generally one that, when compared with main sensor 102, is less accurate, slower and/or noisier; operates using different working principles; and/or includes additional secondary sensing tasks. Secondary sensor 104 can therefore be less expensive than main sensor 102 and may also have fewer restrictions on positioning, chip area and other factors that affect the cost and complexity of system 100. These secondary sensing tasks can include measurement of compensation signals, such as temperature, mechanical stress, internal operational or bias voltages, operational or bias currents, and/or additional, simpler target measurements. For example, sensors 102 and 104 comprise magnetic field sensors in an embodiment, and a target measurement of such sensors would be magnetic fields. In embodiments, however, secondary sensor 104 can comprise a plurality of sensors or a sensor array, such as a magnetic field sensor to mirror main sensor 102 as well as a temperature sensor and a stress sensor in one example embodiment.

In an embodiment, however, the secondary sensor and signal path can be used in a plausibility comparison with the main sensor and signal path. Further, the secondary sensor and signal path can be used for fault detection as well as verification of the main sensor and signal path. Several advantages can be provided by such a configuration. First, SIL compatibility can be achieved. Second, size and cost advantages can be realized as compared with conventional solutions, and self-testing can be carried out during normal operation without significant additional hardware. Further, additional self-testing features of the digital signal processing (DSP) and of the signal processing software can be implemented. Additionally, field failure and return rates can also be reduced, improving cost efficiencies on both sides, i.e., for the original chip manufacturer as well as the customer implementing the chip.

Figure 2:
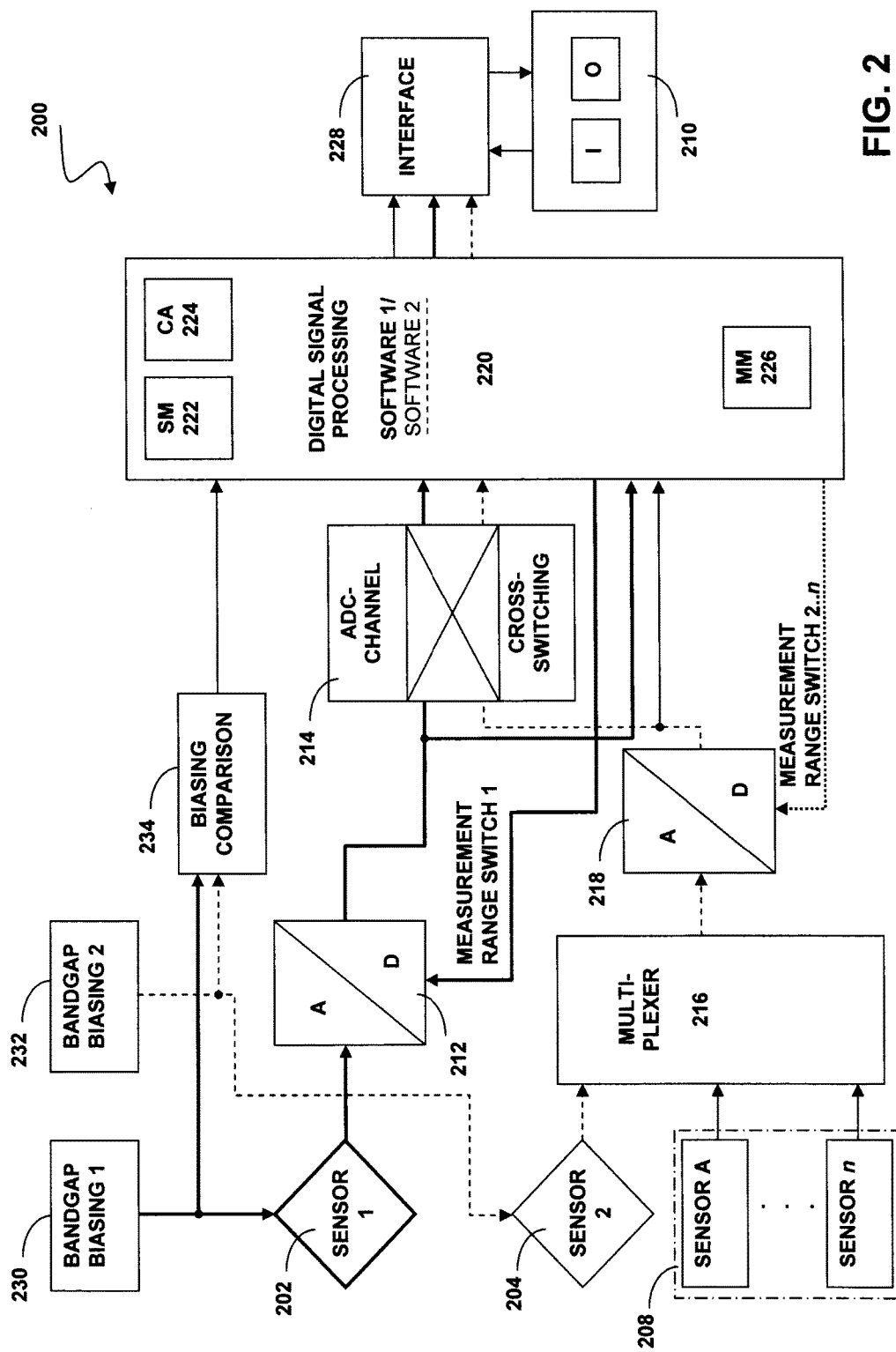
FIG. 2 depicts a system block diagram according to an embodiment.

Referring to FIG. 2, a block diagram of an embodiment of a sensor system 200 based on the concept depicted in FIG. 1 is depicted. System 200 includes a main magnetic field sensor 202 and a secondary magnetic field sensor 204, such as Hall effect or giant magneto-resistive (GMR), though sensors 202 and 204 can be other types of sensors in other embodiments and are not limited to magnetic field sensors. Sensor 202 is similar conceptually to sensor 102, while sensor 204 is similar conceptually to sensor 104, discussed above with reference to FIG. 1.

System 200 also comprises one or more additional sensors 208, also considered secondary or ancillary sensors. Sensor(s) 208 can include temperature, stress, current, magnetic field or some other sensor format in various embodiments.

In an embodiment, main sensor 202 communicates with a digital signal processing (DSP) portion 220. DSP portion 220 can in turn communicate with an external ECU or other control unit (refer, for example, to FIG. 1) via an input/output 210. According to an embodiment, sensors 202 and 204 communicate with DSP portion 220 via distinct signal paths, which can include structurally different analog signal paths, mixed signal paths and, to a certain extent, digital signal paths and processes, and software components. In FIG. 2, a main signal path associated with main sensor 202 is shown in bolded line, while a secondary signal path associated with sensor 204 is shown in simple dashed line.

For example, in the embodiment of FIG. 2, the main signal path can communicate a signal from main sensor 202 to an analog-to-digital (A/D) converter 212 and A/D conversion channel cross-switch 214. A secondary signal path communicates a signal from secondary sensor 204 to a multiplexer 216, which also receives as input(s) any signals from additional or ancillary sensors 208. The secondary signal path then continues from MUX 216 to a second A/D converter 218, which also sends its output to cross-switch 214.

In an embodiment, elements of the main signal path and elements of the secondary signal path are not identical and/or are implemented using different working principles. For example, A/D converter 212 in the main signal path can comprise a sigma-delta converter of the third order while A/D converter 218 in the secondary signal path can comprise a sigma-delta converter of the first order, or one or more the A/D converters can utilize a successive approximation register (SAR) or flash technique instead of sigma-delta. In other words, as with secondary sensor 204 being generally one that, when compared with main sensor 102, is less accurate, slower and/or noisier, operates using different working principles, and/or includes additional secondary sensing tasks, the same can be true for A/D converter 218 when compared with A/D converter 212. Further, the secondary sensor 204 when compared with main sensor 102 may have a lower sampling rate, higher latency time, lower bandwidth, smaller analog-to-digital conversion resolution, smaller signal range, different signal encodings, different mapping of sensor signals, different compensation algorithms, and/or a different processing schedule. Even further, the secondary sensor 204 may comprise fewer second sensing elements than the main sensor 102 comprises first sensing elements. The secondary sensor 204 also may comprise second sensing elements of a smaller second sensitive area than the main sensor 102 comprises first sensing elements of a first sensing area.

The different working principle may be implemented in any of a number of manners. The different working principle may be implemented for a functional portion of the first signal path as a hardware implementation, while a corresponding functional portion of the second signal path is implemented as software. Alternatively, the different working principle may be implemented using a different sensing technology for the first signal path than for the second signal path. Alternatively, the different working principle may be implemented by employing for a first functional portion of the first signal path a functional processing hardware that is at least in part different from a second functional portion of the second signal path corresponding to the first functional portion.

Outputs of cross-switch 214 are associated with both the main and secondary signal paths and are fed to a digital signal processing (DSP) portion 220. DSP 220 includes a state machine 222, a clamping algorithm 224 and a memory matrix 226 in an embodiment. Consistent with the main and secondary signal paths concept, DSP 220 also includes a first software portion associated with the main signal path and a second software portion associated with the secondary signal path. Additionally or alternatively, DSP 220 can also implement different DSP methodologies or techniques for the main signal path and the second signal path. In an embodiment, DSP 220 is coupled to I/O 210 via an interface 228, and I/O 210 is in turn coupled to an external ECU (not depicted in FIG. 2).

The DSP 220 may be implemented as a multicore processor, or more than one DSP. Multi-core DSPs may comprise identical cores or different cores. The DSP 200 may have a DSP of one provider in the main path, and a multi-core DSP from a different provider in the secondary signal path.

The main and secondary signal paths thereby can provide two different, quasi-redundant analog signal paths that provide numerous beneficial properties. For example, transmission of the main magnetic field signal from sensor 202 in a cycle via the main signal path can provide a highly precise computational result, wherein the main signal path itself operates very precisely, such as by using chopping or other techniques, and quickly, at least with respect to the secondary signal path. The main signal path also operates as independently and freely, without being influenced by other system components.

For analytic purposes, the secondary signal path also provides the possibility of providing its data to the control unit, where the data could be processed with either a positive or a negative sign. Possible parallel outputs from DSP 220 to interface 228 and I/O 210 are shown in system 200, while sequential transmissions could also be implemented, utilizing time-division multiplex or on demand as externally requested, for example.

The outputs from DSP 220 to interface 228 may be output via only one terminal which, depending on a multiplexing scheme, will at one instance provide a first output signal associated with the main signal path and at another instant, in accordance with the multiplexing scheme, a second output signal associated with the secondary signal path.

Sensors 202 and 204 and optionally 208 can utilize different sensing principles with respect to their measured values, including processes, technological performance and specifications, size and/or placement of the sensors 202 and 204 themselves, and biasing. An embodiment of system 200 includes two bandgap biasing portions 230 and 232 and a biasing comparison 234. Biasing portion 230 is associated with the main signal path, and biasing portion 232 is associated with the secondary signal path. Biasing portions 230 and 232 provide the option of different biasing of sensors 102 and 104, respectively, while biasing comparison 234 can provide an output signal to DSP 220 for consideration.

Embodiments of system 200 can also utilize different A/D conversion and/or switching concepts, via A/D converters 212 and 218 and cross-switch 214. For example, as previously mentioned, A/D converter 212 in the main signal path can comprise a sigma-delta converter of the third order while A/D converter 218 in the secondary signal path can comprise a sigma-delta converter of the first order, or one or more the A/D converters can utilize a successive approximation register (SAR) or flash technique instead of sigma-delta. In various embodiments, these different A/D conversion and/or switching concepts can provide different fault behaviors and/or failure probabilities. Measurement ranges can also be switched in embodiments, via the noted inputs to A/D converters 212 and 218 in FIG. 2, in order to detect clamping or limiting effects.

Embodiments can also provide the option of switching the sensors 202 and 204 with their respective main and secondary signal paths. For example, secondary sensor 204 can be exchanged into the main signal path, and likewise with sensor 202 and the secondary signal path. This option can provide improved fault detection and/or locating by isolating a sensor from its path, for example.

Another advantage presented by embodiments of system 200 is the ability to compare, such as by forming quotients, the output signals of each of the main and secondary signal paths and evaluate the result. The result can be evaluated to determine one or more aspects related to the performance or functioning of sensors 202 and 204, the signal paths, system 200 and/or some other component. For example, comparing the output signals can detect a rapid change in the input signal. In embodiments utilizing compensation, such as temperature compensation when sensor 208 comprises a temperature sensor, the output signals can be compared as a function of the temperature compensation signal. In other embodiments, clamping or limiting of information from sensors 208 can be implemented to isolate other signals, properties or information.

Because DSP 220 utilizes software 1 for the main signal path and software 2 for the secondary signal path, output results of the signal paths can be compared in embodiments. Such a comparison can provide a check of the software algorithms themselves. Internal or external window comparisons can also be used in plausibility checks of the two signal paths or computational results of DSP 220. As part of such a plausibility check, warning and/or failure thresholds can be implemented.

The comparison of the output results of the two signal paths may comprise forming at least one of a quotient, a linear transformation of the output results of the two signal paths, and a comparison of an absolute difference between the output results of the two signal paths against a difference threshold.

Embodiments can therefore provide safety standard compatibility as well as fault self-diagnostics in a sensor system. While the handling of faults can vary according to the type and severity as well as the particular system at issue and/or relevant safety standards, embodiments can provide opportunities to alert system users of detected issues. For example, in a safety-critical automotive electronic power steering sensor application utilizing magnetic field sensors, detected faults can lead an ECU to alert a driver of a critical system issue such that appropriate action can be taken. In certain applications, an ECU can be programmed to switch to a safe mode or secure operating protocol in an error fault or deviation situation.

Further, embodiments are more space- and cost-efficient than conventional solutions utilizing redundant primary sensors. For example, the main/secondary sensor and signal path can increase chip area by less than 10% in embodiments while utilizing only a single primary sensor, rather than two, with the secondary sensor typically being a less expensive device in view of the reduced demands on its performance. In view of the less expensive secondary sensor, advantages are also achieved over conventional solutions utilizing two primary sensors on a single chip.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A monolithic integrated circuit, comprising:
 a first sensor device configured to indicate a physical quantity, the first sensor device having a first signal path for a first sensor signal on a semiconductor chip; and
 a second sensor device configured to indicate the physical quantity, the second sensor device having a second signal path for a second sensor signal on the semiconductor chip, the second signal path separate and distinct from the first signal path,
 wherein the second sensor device comprises at least one characteristic selected from the group of characteristics consisting of:
  fewer second sensing elements than the first sensor device comprises first sensing elements, the second sensor device comprises second sensing elements of a smaller second sensitive area than the first sensor device comprises first sensing elements of a first sensing area, the second sensor device has a different working principle compared with the first sensor device, the second sensor device has different signal encodings compared with the first sensor device, the second sensor device has different mapping of sensor signals compared with the first sensor device, the second sensor device has different compensation algorithms compared with the first sensor device, or the second sensor device has a different processing schedule compared with the first sensor device, or wherein the second signal path comprises at least one characteristic selected from the group of characteristics consisting of:

the second signal path, when compared with the first signal path, has a lower sampling rate, the second signal path, when compared with the first signal path, has a higher latency time, the second signal path, when compared with the first signal path, has a lower bandwidth, the second signal path, when compared with the first signal path, has a smaller analog-to-digital conversion resolution, or the second signal path, when compared with the first signal path, has a smaller signal range, and wherein a first output signal related to the first signal path and a second output signal related to the second signal path are communicable from the monolithic integrated circuit to an external controller.

2. The monolithic integrated circuit of claim 1, wherein the different working principle is implemented for a functional portion of the first signal path as a hardware implementation, while a corresponding functional portion of the second signal path is implemented as software.

3. The monolithic integrated circuit of claim 1, wherein the different working principle is implemented using a different sensing technology for the first signal path than for the second signal path.

4. The monolithic integrated circuit of claim 1, wherein the different working principle is implemented by employing for a first functional portion of the first signal path a functional processing hardware that is at least in part different from a second functional portion of the second signal path corresponding to the first functional portion.

5. The monolithic integrated circuit of claim 1, further comprising:

a digital signal processor (DSP) on the semiconductor chip and coupled to the first and second signal paths to receive the first and second signal path signals, wherein the DSP is configured to compare the first and second signal path signals.

6. The monolithic integrated circuit of claim 5, wherein the DSP comprises a first digital signal processing portion associated with the first signal path and a second digital signal processing portion associated with the second signal path.

7. The monolithic integrated circuit of claim 5, wherein the DSP is coupled to the first and second signal paths by an analog-to-digital (A/D) conversion channel cross-switching device.

8. The monolithic integrated circuit of claim 1, further comprising:

at least one additional sensor device coupled to one of the first signal path and the second signal path.

9. The monolithic integrated circuit of claim 8, wherein the at least one additional sensor device is selected from the group consisting of a temperature sensor, a stress sensor, a current sensor, a voltage sensor, and a magnetic field sensor.

10. The monolithic integrated circuit of claim 8, further comprising:

a multiplexer on the semiconductor chip configured to couple the second sensor device and the at least one additional sensor device to the selected one of the first and second signal paths.

11. The monolithic integrated circuit of claim 1, wherein the first and second sensor devices comprise magnetic field sensors.

12. The monolithic integrated circuit of claim 1, further comprising:

a first biasing circuit coupled to the first sensor device and the first signal path, and a second biasing circuit coupled to the second sensor device and the second signal path.

13. The monolithic integrated circuit of claim 12, further comprising:

a biasing comparator configured to receive a first biasing signal from the first biasing circuit and a second biasing signal from the second biasing circuit and to compare the first and second biasing signals.

14. A method of monitoring a monolithic integrated circuit, comprising:

implementing, on a single semiconductor chip, a main signal path comprising a main sensor;

implementing, on the single semiconductor chip, a secondary sensor and a secondary signal path, the secondary signal path separate and distinct from the main signal path and, wherein the secondary sensor comprises at least one characteristic selected from the group of characteristics consisting of:

fewer second sensing elements than the main sensor comprises first sensing elements, the secondary sensor comprises second sensing elements of a smaller second sensitive area than the main sensor comprises first sensing elements of a first sensing area, the secondary sensor has a different working principle compared with the main sensor, the secondary sensor has different signal encodings compared with the main sensor, the secondary sensor has different mapping of sensor signals compared with the main sensor, the secondary sensor has different compensation algorithms compared with the main sensor, or the secondary sensor has a different processing schedule compared with the main sensor, or wherein the secondary signal path comprises at least one characteristic selected from the group of characteristics consisting of:

the secondary signal path, when compared with the main signal path, has a lower sampling rate, or the secondary signal path, when compared with the main signal path, has a higher latency time, the secondary signal path, when compared with the main signal path, has a lower bandwidth, the secondary signal path, when compared with the main signal path, has a smaller analog-to-digital conversion resolution, or the secondary signal path, when compared with the main signal path, has a smaller signal range;

providing the signal of the main signal path as a first output signal and the signal of the secondary signal path as a second output signal; and comparing the first output signal and the second output signal.

15. The method of claim 14, further comprising multiplexing at least one additional sensor to the secondary signal path.

16. The method of claim 15, further comprising receiving at least one compensation signal from the at least one additional sensor.

17. The method of claim 14, further comprising:
biasing the main sensor by a first biasing portion;
biasing the secondary sensor by a second biasing portion different from the first biasing portion; and
measuring a biasing current of the main sensor and a biasing current of the secondary sensor.

18. The method of claim 14, further comprising:
coupling the main and secondary signal paths to a digital signal processor (DSP);
processing the signal of the main signal path using a first software portion of the DSP to determine the first output signal; and
processing the signal of the secondary signal path using a second software portion of the DSP to determine the second output signal, the second software portion different from the first software portion.

19. The method of claim 18, further comprising:
providing parallel outputs of the DSP comprising a main signal path portion and a secondary signal path portion.

20. The method of claim 14, wherein the comparing comprises forming at least one of a quotient or a linear transformation of the signal of the main signal path and the signal of the secondary signal path.

21. The method of claim 20, further comprising evaluating the at least one quotient or linear transformation.

22. The method of claim 14, further comprising:
adjusting a measurement range of a selected one of the main sensor or the secondary sensor, while a measurement range for the non-selected one of the main sensor or the secondary sensor remains unaltered.

23. The method of claim 14, further comprising exchanging the main sensor and the secondary sensor such that the main sensor is coupled to the secondary signal path and the secondary sensor is coupled to the main signal path.

24. The monolithic integrated circuit of claim 2, wherein the external controller is configured to provide an alert in response to the communicable first and second output signals being received and compared by the external controller.

25. The method of claim 19, further comprising:
providing the first output signal by the main signal path portion; and
providing the second output signal by the secondary signal path portion.

26. The method of claim 18, further comprising:
providing the first output signal by an output portion; and
providing the second output signal by the output portion using a time multiplexing scheme.

27. The method of claim 25, further comprising coupling the parallel outputs of the DSP to an external controller.

28. The method of claim 26, further comprising providing an alert by the external controller as a result of the comparing.

29. The method of claim 14, wherein the comparing is carried out on the single semiconductor chip.

30. The method of claim 18, further comprising providing as a result of the comparing at least one of:
identification of an error or deviation in the monolithic integrated circuit;
a plausibility check of at least one of the sensors, the signal paths, or the DSPs; or
a verification of at least one of the sensors, the signal paths, or the DSP.

31. The monolithic integrated circuit of claim 1, wherein the first output signal and the second output signal are communicable from the monolithic integrated circuit to the external controller for a comparison.

32. The monolithic integrated circuit of claim 31, wherein the comparison comprises at least one of identification of an error or deviation in the monolithic integrated circuit, a plausibility check of at least one of the sensors, the signal paths, or the DSPs, or a verification of at least one of the sensors, the signal paths, or the DSPs.

33. The monolithic integrated circuit of claim 31, wherein the comparison comprises forming at least one of a quotient, a linear transformation of the first output signal and the second output signal, a comparison of an absolute difference between the first output signal and the second output signal against a difference threshold.

34. The method of claim 14, further comprising:
implementing a first analog-to-digital (A/D) conversion technique on the main signal path; and
implementing a second A/D conversion technique on the secondary signal path, the second A/D conversion technique being different from the first A/D conversion technique.

35. The monolithic integrated circuit of claim 1, wherein the first signal path comprises a first analog-to-digital (A/D) converter and the second signal path comprises a second A/D converter different from the first A/D converter, and the first output signal related to the first signal path from the first A/D converter and the second output signal related to the second signal path from the second A/D converter are communicable from the monolithic integrated circuit to the external controller.

36. The monolithic integrated circuit of claim 35, wherein the first A/D converter operates with at least one working principle distinct from a working principle of the second A/D converter.

37. The monolithic integrated circuit of claim 5, wherein the DSP comprises a first digital signal processing portion associated with only the first signal path and a second digital signal processing portion associated with only the second signal path.

38. The monolithic integrated circuit of claim 2, wherein the external controller is configured to receive and compare the communicable first and second output signals.

* * * * *